US00RE36781E

United States Patent [19]

Lee et al.

[11] E Patent Number: Re. 36,781

[45] Reissued Date of Patent: Jul. 18, 2000

[54] DIFFERENTIAL COMPARATOR FOR AMPLIFYING SMALL SWING SIGNALS TO A FULL SWING OUTPUT

[75] Inventors: Thomas H. Lee, Cupertino; Kevin S. Donnelly, San Francisco, both of Calif.

[73] Assignee: Rambus, Inc., Mountain View, Calif.

[21] Appl. No.: 09/291,091

[22] Filed: Apr. 13, 1999

Related U.S. Patent Documents

Reissue of:

[64] Patent No.: 5,621,340
Issued: Apr. 15, 1997
Appl. No.: 08/510,141
Filed: Aug. 2, 1995

[51] Int. Cl.[7] ..... H03K 17/10; H03K 17/04; H03F 3/45

[52] U.S. Cl. ..... 327/65; 327/77; 327/89; 327/374

[58] Field of Search ..... 327/63, 65, 77, 327/89, 205, 333, 374, 375, 384, 307, 563

[56] References Cited

U.S. PATENT DOCUMENTS

| | | | |
|---|---|---|---|
| 3,863,080 | 1/1975 | Steckler | 327/9 |
| 4,110,641 | 8/1978 | Payne | 327/67 |
| 4,249,095 | 2/1981 | Hsu | 327/53 |
| 4,394,587 | 7/1983 | McKenzie et al. | 327/66 |
| 4,547,685 | 10/1985 | Wong | 327/54 |
| 4,573,022 | 2/1986 | Koga | 330/261 |
| 4,739,194 | 4/1988 | Glasby et al. | 330/261 |
| 5,057,788 | 10/1991 | Ushida et al. | 330/261 |
| 5,077,489 | 12/1991 | Gola et al. | 327/77 |
| 5,132,640 | 7/1992 | Tanaka et al. | 330/261 |
| 5,281,865 | 1/1994 | Yamashita et al. | 327/208 |
| 5,289,054 | 2/1994 | Lucas | 327/202 |
| 5,448,200 | 9/1995 | Fernandez et al. | 327/202 |
| 5,488,321 | 1/1996 | Johnson | 327/66 |

*Primary Examiner*—Timothy P. Callahan
*Assistant Examiner*—Terry L. Englund
*Attorney, Agent, or Firm*—Pennie & Edmonds LLP

[57] ABSTRACT

A differential comparator that amplifies small swing signals to full swing signals. The differential comparator comprises a current switch having a pair of inputs coupled to receive a pair of small swing complementary input signals and a pair of complementary outputs that output complementary signals. The complementary signals output by the current switch have a voltage swing that centers about a predetermined voltage in response to the complementary input signals. The differential comparator further comprises first and second inverters coupled to receive the output complementary signals, wherein each inverter has a trip point voltage [equal] *corresponding* to the predetermined voltage. The first and second inverters output full swing complementary output signals in response to the complementary signals output by the current switch.

20 Claims, 3 Drawing Sheets

DIFFERENTIAL COMPARATOR FOR AMPLIFYING SMALL SWING SIGNALS TO A FULL SWING OUTPUT

Matter enclosed in heavy brackets [ ] appears in the original patent but forms no part of this reissue specification; matter printed in italics indicates the additions made by reissue.

FIELD OF THE INVENTION

The present invention relates generally to comparator circuits and more particularly to differential comparator circuits that amplify small swing input signals to full swing output signals.

BACKGROUND OF THE INVENTION

A differential comparator is often used in clock acquisition circuits such as delay-locked loops (DLL) and phase locked loops (PLL) to compare the value of a voltage at a first terminal of the differential comparator to the value of a voltage at a second terminal of the differential comparator. For some applications, the signals provided at the inputs of the differential comparator are "small swing" signals that have small amplitudes relative to the supply voltage levels. For example, for CMOS circuits wherein the supply voltage VCC is equal 3.3 volts and system ground VSS is equal to zero volts, a small swing signal may have an amplitude of 0.5 volts that swings between a low of 1.5 volts and a high of 2.0 volts. A "full swing" signal swings approximately between 3.3 volts and zero volts (ground).

Clock acquisition circuits are typically used to clock the circuitry of an integrated circuit, and the differential comparator must output full swing signals to drive the integrated circuit. The differential comparator circuit must therefore provide gain to amplify the small swing input signals to a full swing output signal. For higher frequency applications, it is difficult to provide the necessary gain using prior differential comparators.

SUMMARY AND OBJECTS OF THE INVENTION

Therefore, it is an object of the present invention to provide a differential comparator that amplifies small swing signals into full swing signals.

It is a further object of the present invention to provide a CMOS differential comparator that amplifies small swing input signals to full swing output signals at higher frequencies.

A differential comparator that amplifies small swing signals to full swing signals is described. The differential comparator comprises a current switch having a pair of inputs coupled to receive a pair of small swing complementary input signals and a pair of complementary outputs that output complementary signals. The complementary signals output by the current switch have a voltage swing that centers about a predetermined voltage in response to the complementary input signals. The differential comparator further comprises first and second inverters coupled to receive the complementary signals, wherein each inverter has a trip point voltage [equal] *corresponding* to the predetermined voltage. The first and second inverters output full swing complementary output signals in response to the complementary signals.

Because the outputs of the current switch center about the trip point voltage of the inverters, the inverters provide a current path between VCC and VSS during normal operation. According to one embodiment, the differential comparator includes circuitry for disabling the differential comparator during a power-down mode of operation such that the differential comparator draws little or no current. Part of this functionality is provided by designing the inverters to be tri-statable. The need for additional disabling circuitry for disabiling the current switch, is dictated by the circuit topology of the current switch.

Other objects, features, and advantages of the present invention will be apparent from the accompanying drawings and from the detailed description which follows below.

BRIEF DESCRIPTION OF THE DRAWINGS

The present invention is illustrated by way of example and not by way of limitation in the figures of the accompanying drawings, in which like references indicate similar elements, and in which.

DETAILED DESCRIPTION

A differential comparator according to the present embodiments quickly amplifies small swing differential input signals to generate full swing complementary output signals. The differential comparator generally comprises an input stage, a gain stage, and an output stage. The gain stage generally comprises inverters each having a trip point voltage of $V_{TR}$. The input stage acts as a current switch that outputs complementary output signals each having a voltage swing that centers about the trip point voltage $V_{TR}$. Centering the output signals of the input stage about the trip point voltage $V_{TR}$ enables the inverters of the gain stage to switch on and off quickly to provide full swing output signals. The output stage provides additional gain.

Figure 1:
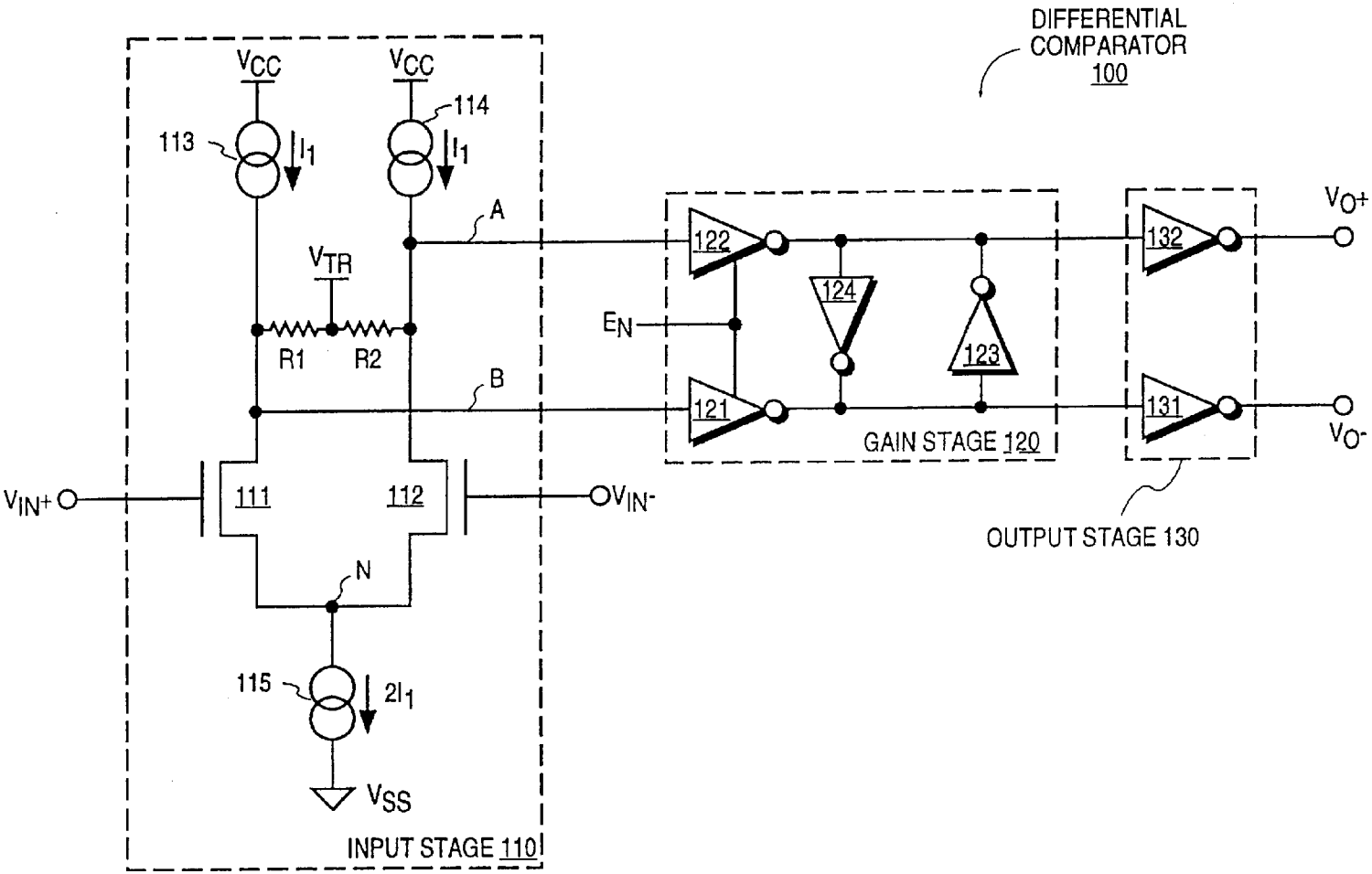
FIG. 1 shows a differential comparator according to one embodiment.

FIG. 1 shows a differential comparator 100 according to one embodiment. Differential comparator 100 comprises an input stage 110, a gain stage 120, and an output stage 130 coupled in series. Input stage 110 accepts small swing differential input signals $V_{in+}$ and $V_{in-}$. The amplitude of the differential input signal $V_{in}$ may be, for example, 0.5 volts. Input stage 110 provides a modest gain, and output signals of input stage 110 are provided via output nodes A and B to gain stage 120, which amplifies the output signals of the input stage 110 into full swing signals. Output stage 130 provides further gain, speeding the transitions between the rail voltages and providing sufficient output current to drive the capacitive load of the remaining portions of the integrated circuit.

Input stage 110 is shown as a common source differential amplifier that operates as a current switch wherein a current having a value of $2I_1$ is switched between the transistors of the differential amplifier. Alternative current switch and differential amplifier architectures may be used. Input stage 110 includes a differential pair of NMOS transistors 111 and 112, each having their sources coupled to system ground VSS via a common node N and current source 115 and their drains coupled to the supply rail VCC via current sources 113 and 114, respectively. Current sources 113 and 114 are each selected to source a current having a value of $I_1$, and current source 115 is selected to sink a current having a value of twice $I_1$. Output node A is taken at the drain of transistor 112, and output node B is taken at the drain of node 111.

Resistors R1 and R2 having equal values are coupled in series between output nodes A and B. A trip point supply voltage $V_{TR}$ is provided at the common node between resistors R1 and R2. The trip point supply voltage $V_{TR}$ causes the output voltages at output nodes A and B to center around the trip point supply voltage $V_{TR}$. The output voltage at each output node of the input stage 110 is approximately ($V_{TR}\pm I_1R$), wherein R is the value of each of the transistors R1 and R2. Wherein Vin+>Vin−, the voltage at output node A is approximately ($V_{TR}+I_1R$), and the voltage at output node B is approximately ($V_{TR}-I_1R$). Conversely, wherein Vin+<Vin−, the voltage at output Node A is approximately ($V_{TR}-I_1R$), and the voltage at output node B is approximately ($V_{TR}+I_1R$).

Gain stage 120 comprises a first input inverter 121 having its input coupled to output node B and a second input inverter 122 having its input coupled to output node A. Both input inverters are CMOS inverters. The value of trip point supply voltage $V_{TR}$ is selected to be the value of the trip point voltage of input inverters 121 and 122 such that inverters 121 and 122 switch on and off quickly.

Because the output voltages of input stage 110 center about the trip point voltage of input inverters 121 and 122, input inverters 121 and 122 can change states quickly. Unfortunately, the MOS transistors of inverters 121 and 122 are never fully switched off. To reduce the power consumption of input inventers 121 and 122, input inverters 121 and 122 are tri-statable. Each input inverter therefore includes an enable input coupled to receive an enable signal EN for coupling and decoupling the inverters from the supply rails. The enable signal may be deasserted low, for example, when the integrated circuit and differential comparator are to be placed in a power-down mode wherein power consumption of differential comparator 100 is reduced. As will be described with respect to FIG. 4, differential comparator 100 draws no current when operating in the power-down mode.

Cross-coupled inverters 123 and 124 are provided to improve the power supply rejection of differential comparator 100. Disturbances in the power supplies of input inverters 121 and 122 may result in one of the output signals of the input inverters beginning to switch between rail voltages before the other output signal. Cross-coupled inverters 123 and 124 compensate for this effect. Inverter 123 has its input coupled to the output of input inverter 121 and its output coupled to the output of input inverter 122. Similarly, inverter 124 has its input coupled to the output of inverter 122 and its output coupled to the output of inverter 121. The cross-coupled inverters help to ensure that the differential output voltages of gain stage 120 cross approximately at the threshold voltage $V_{TR}$.

Cross-coupled inverters 123 and 124 need not provide as much current as input inverters 121 and 122. Therefore, according to one embodiment, the channel widths of the CMOS transistors of cross-coupled inverters 123 and 124 are approximately 20% of the channel widths for input inverters 121 and 122. Cross-coupled inverters 123 and 124 may also be tri-statable.

Output stage 130 comprises inverters 131 and 132. The input of inverter 131 is coupled to the output of inverter 121, and the input of inverter 132 is coupled to the output of inverter 122. Output inverters 131 and 132 provide additional gain and provide sufficient current to drive the capacitive load of an integrated circuit coupled to the outputs of differential comparator 100. Output inverters 131 and 132 may also be tri-statable.

Figure 2:
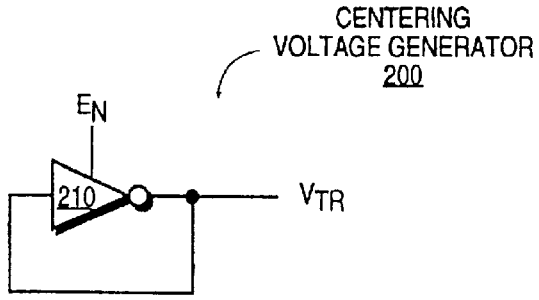
FIG. 2 shows a voltage generator that supplies a trip point voltage $V_{TR}$.

FIG. 2 shows a voltage generator 200 that supplies the trip point voltage $V_{TR}$. According to the present embodiment, centering voltage generator 200 comprises an inverter 210 having the same operating characteristics as input inverters 121 and 122 wherein inverter 210 has its output coupled to its input. The use of matching inverter 210 makes the centering voltage generator 200 less susceptible to process variations that affect the trip point voltages of input inverters 121 and 122.

Figure 3:
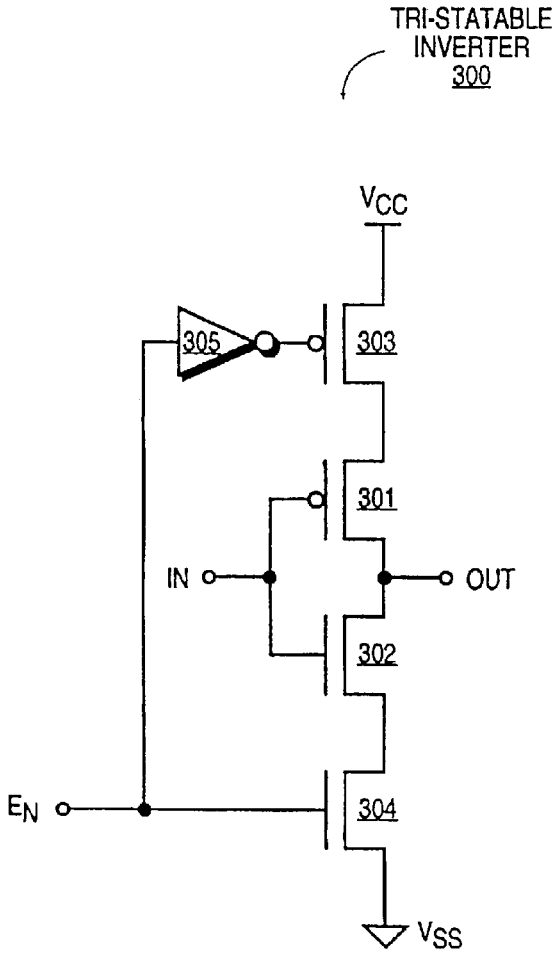
FIG. 3 shows a tri-statable inverter according to one embodiment.

FIG. 3 shows a tri-statable inverter 300 according to one embodiment. Tri-statable inverter 300 generally comprises a CMOS inverter which includes a PMOS transistor 301 and an NMOS transistor 302 having their gates commonly coupled to an input node and their drains commonly coupled to an output node. The source of PMOS transistor 301 is coupled to VCC via PMOS transistor 303, and the source of NMOS transistor 302 is coupled to system ground VSS via NMOS transistor 304. The enable signal EN is coupled directly to the gate of transistor 304 and to the gate of transistor 303 via inverter 305 for removing the conductive path between VCC and VSS when it is desirable to reduce the power consumption of differential comparator 100. When the enable signal EN is logic low (deasserted), transistors 303 and 304 are switched off. Tri-stable inverter 300 operates as a normal CMOS inverter when enable signal EN is logic high (asserted). Enable signal EN may alternatively be provided as an active low signal.

Figure 4:
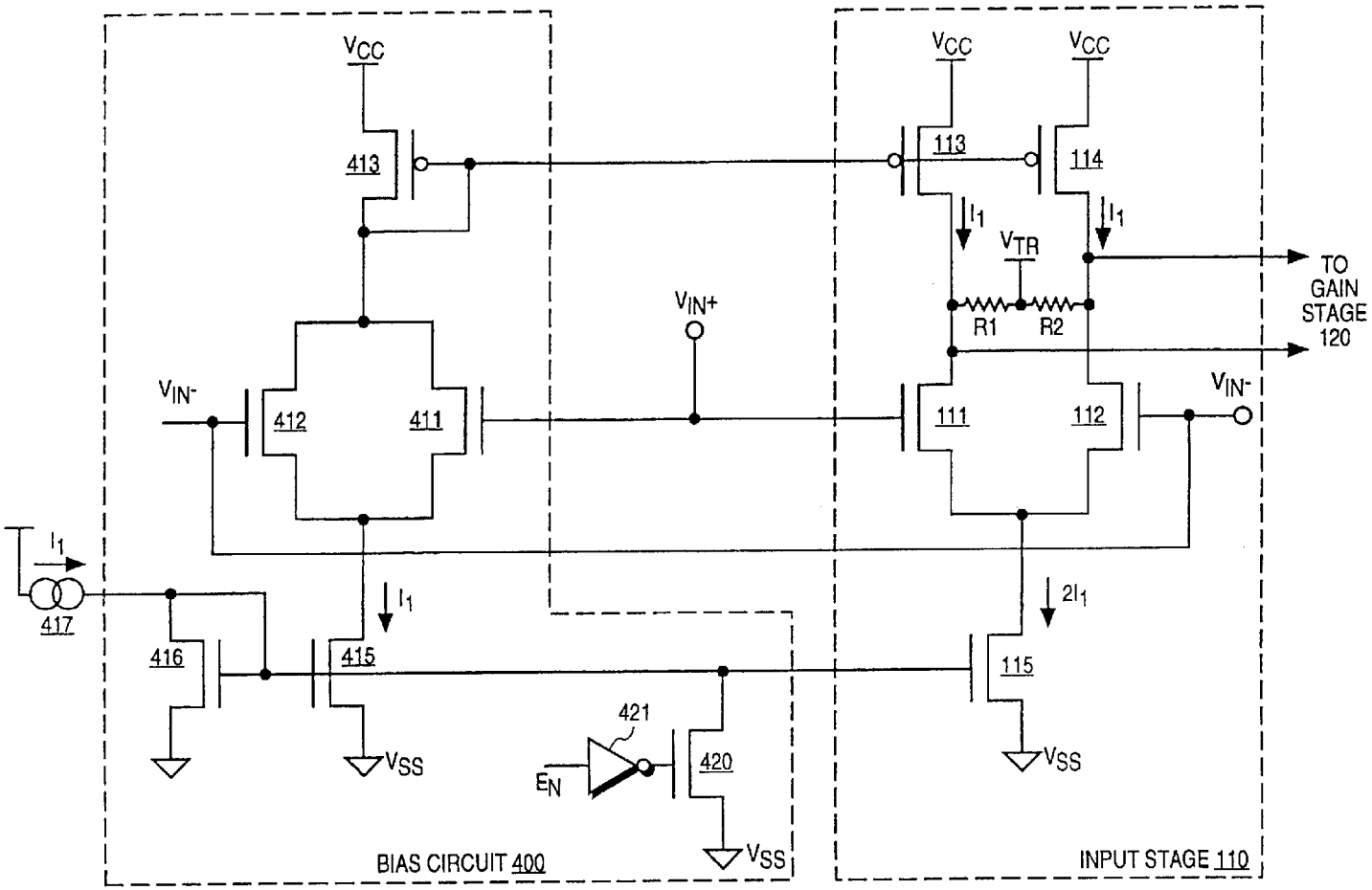
FIG. 4 shows a differential comparator as including a bias circuit.

FIG. 4 shows differential comparator 100 as further including a bias circuit 400 for ensuring proper current values of current sources 113, 114 and 115 and for switching off the current sources when differential comparator 100 is placed in the power-down mode. According to one embodiment, current sources 113 and 114 are matched PMOS transistors, and current source 115 is an NMOS transistor. Bias circuit 400 provides biasing current to the gates of transistors 113, 114 and 115 such that transistors 113–115 conduct the appropriate amount of source-drain current.

Bias circuit 400 generally comprises a pair of differential input transistors 411 and 412 that are approximately half the size of transistors 111 and 112 of input stage 110. The gates of transistors 411 and 412 are coupled to differential input voltages $V_{in+}$ and $V_{in-}$, respectively. The sources of transistors 411 and 412 are commonly coupled to VSS via NMOS transistor 415, which is approximately half the size of NMOS transistor 115 of input stage 110. NMOS transistor 416 has matching characteristics to transistor 415 and is coupled to receive an external bias current $I_1$ from a current source 417, which may be a bandgap voltage generator. Transistor 416 is coupled in a current mirroring arrangement to the gate of transistor 415 such that transistor 415 sinks a current $I_1$. The gate of transistor 115, which is twice the size of transistor 416, also has its gate coupled to the gate of transistor 416 such that transistor 115 sinks a current $2I_1$.

The drains of transistors 411 and 412 are commonly coupled to the drain of transistor 413. Transistor 413 has its gate commonly coupled to the gates of transistors 113 and 114 in a current mirroring arrangement such that the drain currents of transistor 113 and 114 are of the desired value.

Transistor 420 and inverter 421 are provided such that the current sources of input stage 110 are switched off to disable differential comparator 100 during power-down mode. Transistor 420 has its drain coupled to the gate of transistor 115, its source coupled to VSS, and its gate coupled to the output of inverter 421. Inverter 421 has its input coupled to receive enable signal EN. When the EN signal is deasserted low, the output of inverter 421 is high such that transistor 420 is switched on and the gate of transistor 115 is pulled towards ground. This results in all of the current sources 113, 114, and 115 of input stage 110 being switched off. Deasserting the EN signal also tri-states input inverters 121 and 122. Cross-coupled inverters 123 and 124 ensure that the inputs to inverters 131 and 132 are biased to a logic state. Thus, differential comparator 100 draws no current while operating in the power-down mode.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A differential comparator comprising:

a current switch having a pair of inputs coupled to receive a pair of small swing complementary input signals and a pair of complementary outputs that output first complementary output signals having a voltage swing centered about a predetermined voltage in response to the complementary input signals; and first and second inverters coupled to receive the first complementary output signals, wherein each inverter has a trip point voltage [equal] *corresponding* to the predetermined voltage, the first and second inverters outputting second complementary output signals in response to the first complementary output signals, wherein the second complementary output signals are full swing complementary output signals.

2. The differential comparator of claim 1, wherein the current switch comprises:

first and second matched input transistors coupled as a common source differential amplifier, wherein gates of the input transistors form the inputs of the current switch and drains of the input transistors form the outputs of the current switch;

first and second current sources coupled between the respective drains of the input transistors and an operating supply voltage;

a third current source coupled between sources of the input transistors and system ground; and first and second resistors coupled in series between the drains of the input transistors, wherein a common node between the first and second resistors is maintained at *approximately* the trip point voltage of the first and second inverters.

3. The differential comparator of claim 2, wherein an enable signal is provided to the differential comparator such that the differential comparator is enabled for normal operation when the enable signal is asserted, the differential comparator further comprising circuitry for disabling the differential comparator in response to the enable signal being deasserted during a power-down mode of operation wherein the differential comparator draws no power.

4. The differential comparator of claim 2, further comprising cross-coupled third and fourth inverters, wherein an input of the third inverter is coupled to an output of the first inverter and an output of the third inverter is coupled to an output of the second inverter, and an input of the fourth inverter is coupled to the output of the second inverter and an output of the fourth inverter is coupled to the output of the first inverter.

5. The differential comparator of claim 4, further comprising fifth and sixth inverters having inputs coupled to the outputs of the first and second inverters, respectively, wherein the fifth and sixth inverters provide additional gain.

6. A differential comparator comprising:

a differential amplifier comprising a pair of inputs coupled to receive a pair of small swing complementary input signals, a pair of outputs that output first complementary output signals, and first and second resistors coupled in series between the pair of outputs, wherein a common node between the first and second resistors is maintained at a predetermined voltage such that an output swing of the differential amplifier is centered about the predetermined voltage; and first and second inverters coupled to receive the first complementary output signals, wherein each inverter has a trip point voltage [equal] *corresponding* to the predetermined voltage, the first and second inverters outputting second complementary output signals in response to the first complementary output signals, wherein the second complementary output signals are full swing complementary output signals.

7. The differential comparator of claim 6, wherein an enable signal is provided to the differential comparator such that the differential comparator is enabled for normal operation when the enable signal is asserted, the differential comparator further comprising circuitry for disabling the differential comparator in response to the enable signal being deasserted during a power-down mode of operation wherein the differential comparator draws no power.

8. The differential comparator of claim 6, further comprising cross-coupled third and fourth inverters, wherein an input of the third inverter is coupled to an output of the first inverter and an output of the third inverter is coupled to an output of the second inverter, and an input of the fourth inverter is coupled to the output of the second inverter and an output of the fourth inverter is coupled to the output of the first inverter.

9. The differential comparator of claim 8, further comprising fifth and sixth inverters having inputs coupled to the outputs of the first and second inverters, respectively, wherein the fifth and sixth inverters provide additional gain.

10. A differential comparator comprising:

a differential amplifier comprising a pair of inputs coupled to receive a pair of small swing complementary input signals, a pair of outputs that output first complementary output signals and first and second resistors coupled in series between the pair of outputs, wherein a common node between the first and second resistors is maintained at a predetermined voltage such that an output swing of the differential amplifier is centered about the predetermined voltage;

first and second inverters coupled to receive the first complementary output signals, wherein each inverter has a trip point voltage [equal] *corresponding* to the predetermined voltage, the first and second inverters outputting second complementary output signals in response to the first complementary output signals, wherein the second complementary output signals are full swing complementary output signals;

cross-coupled third and fourth inverters, wherein an input of the third inverter is coupled to an output of the first inverter and an output of the third inverter is coupled to an output of the second inverter, and an input of the fourth inverter is coupled to the output of the second inverter and an output of the fourth inverter is coupled to the output of the first inverter; and fifth and sixth inverters having inputs coupled to the outputs of the first and second inverters, respectively, wherein the fifth and sixth inverters [provided] *provide* additional gain.

11. The differential comparator of claim 10, further comprising a seventh inverter having matching characteristics to the first and second inverters, wherein an output of the seventh inverter is coupled to an input of the seventh inverter and the common node between the first and second resistors.

12. A differential comparator comprising:

a current switch having a pair of inputs coupled to receive a pair of small swing complementary input signals and a pair of outputs that output first complementary output signals having a voltage swing centered about a predetermined voltage in response to the complementary input signals; and first and second inverters coupled to receive the first complementary output signals, wherein each inverter has a trip point voltage [equal] *corresponding* to the predetermined voltage, the first and second inverters outputting second complementary output signals in response to the first complementary output signals, wherein the second complementary output signals are full swing complementary output signals;

cross-coupled third and fourth inverters, wherein an input of the third inverter is coupled to an output of the first inverter and an output of the third inverter is coupled to an output of the second inverter, and an input of the fourth inverter is coupled to the output of the second inverter and an output of the fourth inverter is coupled to the output of the first inverter; and fifth and sixth inverters having inputs coupled to the outputs of the first and second inverters, respectively, wherein the fifth and sixth inverters provide additional gain.

13. The differential comparator of claim 12, further comprising first and second resistors coupled in series between the pair of outputs of the current switch, wherein a common node between the first and second resistors is maintained at the predetermined voltage.

14. The differential comparator of claim 13, further comprising a seventh inverter having matching characteristics to the first and second inverters, wherein an output of the seventh inverter is coupled to an input of the seventh inverter and the common node between the first and second resistors.

15. A method for generating full swing complementary signals from small swing complementary signals comprising the steps of:

generating complementary output signals having a voltage swing centered about a predetermined voltage in response to the small swing complementary signals;

providing the complementary output signals to a pair of inverters each having a trip voltage [equal] *corresponding* to the predetermined voltage; and outputting from the pair of inverters the full swing complementary signals.

*16. The differential comparator of claim 1, further comprising cross-coupled third and fourth inverters, wherein an input of the third inverter is coupled to an output of the first inverter and an output of the third inverter is coupled to an output of the second inverter, and an input of the fourth inverter is coupled to the output of the second inverter and an output of the fourth inverter is coupled to the output of the first inverter.*

*17. A differential comparator comprising:*

*a differential amplifier comprising a pair of inputs coupled to receive a pair of small swing complementary input signals and a pair of complementary outputs that output first complementary output signals having a voltage swing centered about a predetermined voltage in response to the complementary input signals; and*

*first and second inverters coupled to receive the first complementary output signals, wherein each inverter has a trip point voltage corresponding to the predetermined voltage, the first and second inverters outputting second complementary output signals in response to the first complementary output signals, wherein the second complementary output signals are full swing complementary output signals.*

*18. The differential comparator of claim 17, wherein the differential amplifier includes first and second resistors coupled in series between the pair of outputs, and a common node between the first and second resistors is maintained at the predetermined voltage.*

*19. The differential comparator of claim 18, wherein the differential amplifier further includes:*

*first and second matched input transistors coupled as a common source differential amplifier, wherein gates of the input transistors form the inputs of the differential amplifier and drains of the input transistors form the outputs of the differential amplifier;*

*first and second current sources coupled between the respective drains of the input transistors and an operating supply voltage; and*

*a third current source coupled between sources of the input transistors and system ground.*

*20. The differential comparator of claim 18, further comprising cross-coupled third and fourth inverters, wherein an input of the third inverter is coupled to an output of the first inverter and an output of the third inverter is coupled to an output of the second inverter, and an input of the fourth inverter is coupled to the output of the second inverter and an output of the fourth inverter is coupled to the output of the first inverter.*

* * * * *